United States Patent [19]

Nakada

[11] Patent Number: 5,079,747
[45] Date of Patent: Jan. 7, 1992

[54] SEMICONDUCTOR MEMORY DEVICE HAVING DIAGNOSTIC UNIT OPERABLE ON PARALLEL DATA BITS

[75] Inventor: Kazuhiro Nakada, Tokyo, Japan
[73] Assignee: NEC Corporation, Tokyo, Japan
[21] Appl. No.: 677,197
[22] Filed: Mar. 29, 1991
[30] Foreign Application Priority Data
   Mar. 30, 1990 [JP] Japan .................. 2-84006
[51] Int. Cl.⁵ ............................. G11C 13/00
[52] U.S. Cl. ................. 361/230.01; 365/201; 371/21.1; 371/51.1
[58] Field of Search ......... 365/230.01, 201, 230.08; 371/10, 21, 51, 67

[56] References Cited
U.S. PATENT DOCUMENTS
4,967,394 10/1990 Minagawa ............... 365/201

Primary Examiner—Terrell W. Fears
Attorney, Agent, or Firm—Sughrue, Mion, Zinn, Macpeak & Seas

[57] ABSTRACT

A semiconductor memory device is installed in one of a single data output and a parallel data output model, and a single data output unit associated with a first diagnostic unit and a parallel data output unit with a second diagnostic unit are incorporated in the semiconductor memory device for selective usage, wherein a first number of data bits read out from memory cells are subjected to diagnosis for supplying a plurality of first diagnostic signals in the signal data output model, however, the first diagnostic signals are further subjected to diagnosis for producing a single second diagnostic signal in the parallel data output model without supplying the first diagnostic signals to the outside thereof so that the internal wiring arrangement is simplified and occupies a small amount of real estate.

6 Claims, 4 Drawing Sheets

SEMICONDUCTOR MEMORY DEVICE HAVING DIAGNOSTIC UNIT OPERABLE ON PARALLEL DATA BITS

FIELD OF THE INVENTION

This invention relates to a semiconductor memory device and, more particularly, to a diagnostic unit incorporated in the semiconductor memory device and operable on parallel data bits.

DESCRIPTION OF THE RELATED ART

A diagnosis is indispensable for highly reliable industrial products, and semiconductor memory devices are subjected to a diagnosis before delivery. However, the diagnostic operation on a semiconductor memory device is prolonged with the number of memory cells, and a parallel diagnosis is desirable for reduction of the time consumed. Even if a semiconductor memory device has a serial data output facility responsive to a single data bit, a parallel diagnostic unit is incorporated in the semiconductor memory device, and a plurality of data bits read out from memory cells are simultaneously checked to see whether or not any one of the memory cells is defective. Namely, data bits of logic "1" level are written into the memory cells, and are, thereafter, read out from the memory cells to the parallel diagnostic unit. If all of the data bits are logic "1" level, the parallel diagnostic unit supplies a resultant data bit of logic "1" level to the serial data output facility When data bits of logic "0" level read out from the memory cells are unchanged, the parallel diagnostic unit supplies a resultant data bit of logic "0" level to the serial data output facility. However, if any one of the data bits is changed in logic level, the parallel diagnostic unit decides that the memory cell is defective, and allows the serial data output facility to enter the high-impedance state. If eight data bits are concurrently subjected to the parallel diagnosis, the diagnostic operation is shrunk to a eighth of a single diagnostic operation. Another parallel diagnostic unit merely compares data bits with one another, and produces a resultant signal indicative of discrepancy or consistency, however, either parallel diagnostic unit needs to compare data bits to see whether or not any one of the data bits is discrepancy from the other bits.

If a semiconductor memory device is equipped with a parallel data output facility responsive to, for example, parallel four data bits, a parallel diagnostic unit is supplied with eight data bits, and every two data bits are compared with each other. In this instance, the resistant signal consists of four bits each indicative of discrepancy or consistency, and the parallel diagnosis is achieved within time period equal to that of the parallel diagnosis unit operable on eight data bits and associated with the data output facility responsive to a single data bit in so far as the semiconductor memory devices are equal in the number of the memory cells to each other.

In order to enhance the compatibility of semiconductor memory devices, the diagnostic unit, both data output facilities and other associated circuits are formed on a single semiconductor pellet, and the semiconductor manufacturer employs either data output facility through a wire bonding stage and/or some lithographic stages.

FIG. 1 shows a typical example of the semiconductor memory device equipped with a parallel diagnostic unit fabricated through the aforesaid selection. The prior art semiconductor memory device comprises eight memory cell arrays MR1, MR2, MR3, MR4, MR5, MR6, MR7 and MR8 each associated with a data amplifier circuit DA1, DA2, DA3, DA4, DA5, DA6, DA7 or DA8, row address decoder units RD1, RD2, RD3 and RD4, and combined units of sense amplifier and column address decoder SC1, SC2, SC3 and SC4 . The data amplifier circuits DA1 to DA8 are respectively coupled to read/write data lines D1 to D8, and both serial and parallel data output facilities each associated with a parallel diagnostic unit are formed for the memory cell arrays MR1 to MR8. The parallel data output facility has four selector circuits SE1, SE2, SE3 and SE4 each coupled at the input nodes thereof to two of the read/write data lines D1 and D2, D3 and D4, D5 and D6, or D7 and D8 and at the output node thereof to a read/write data line D9, D10, D11 or D12. The read/write data lines D9 to D12 are respectively coupled to data output circuits DO1, DO2, DO3 and DO4 which in turn are connected to data output pins DP1, DP2, DP3 and DP4, respectively. The parallel data output facility thus arranged is accompanied with a parallel diagnostic unit which is formed by four exclusive-NOR gates ENR1, ENR2, ENR3 and ENR4. The exclusive-NOR gates ENR1 to ENR4 are provided in association with the selector circuits SE1 to SE4, respectively, and are, therefore, coupled between the read/write data line pairs and diagnostic lines R1 and R4. The diagnostic lines R1 to R4 are respectively coupled to the data output circuits DO1 to DO4.

The parallel data output facility is replaceable with a serial data output facility which comprises the selector circuits SE1 to SE4, a selector circuit SE5 coupled at the input nodes thereof to the selector circuits SE1 to SE4, and a serial data output facility DO5 coupled between the selector circuit SE5 and a data output pin DP5. A parallel diagnostic unit associated with the serial data output facility is implemented by an exclusive-NOR gate ENR5 coupled between the read/write data lines D1 to D8 and the data output circuit DO5. However, the circuits enclosed with a dot-and-dash line DDL are put out of commission in so far as the parallel data output facility is installed.

Assuming now that the parallel data output facility is installed, the diagnosis is carried out as follows. First, data bits of either "1" or "0" level are written into the memory cell arrays MR1 to MR8, and row and column addresses allow eight data bits to be read out from the memory cell arrays MR1 to MR8 to the data amplifier circuits DA1 to DA8. The eight data bits are propagated to the selector circuits SE1 to SE4 as well a to the exclusive-NOR gates ENR1 to ENR4, and the exclusive-NOR gates ENR1 to ENR4 produce diagnostic signals indicative of discrepancy or consistency on the associated read/write data lines D1 to D8. The selector circuits SE1 to SE4 are responsive to the address bit A0C and transfer four data bits to the data output circuits DO1 to DO4. The data output circuits DO1 to DO4 supply resultant signals produced on the basis of the four data bits and the diagnostic signals to the data pins DP1 to DP4, respectively. However, if the semiconductor memory device enters into the usual read-out mode of operation, the diagnostic signals are ignored, and the data output circuits DO1 to DO4 transfer the four data bits to the data pins DP1 to DP4, respectively.

On the other hand, if the parallel data output facility is replaced with the serial data output facility, the eight data bits are supplied from the data amplifier circuits DA1 to DA8 to not only the selector circuits SE1 to SE4 but also the exclusive-NOR gate ENR5. The exclusive-NOR gate ENR5 produces a diagnostic signal indicative of discrepancy or consistency and supplies it to the diagnostic line R5. The four data bits are supplied from the selector circuits SE1 to SE4 to the selector circuit SE5, and the selector circuit SE5 relays one of the four data bits to the data output circuit DO5 in response to the address bits A10C and A10R. If the semiconductor memory device enters the diagnostic operation, the data output circuit DO5 produces a resultant signal to the data pin DP5 on the basis of the single data bit fed from the selector circuit SE5 and the diagnostic signal fed from the exclusive-NOR gate ENR5. However, the diagnostic signal is ignored in the usual read-out mode of operation, and the single data bit is relayed from the data output circuit DO5 to the data pin DP5.

The prior art semiconductor memory device thus arranged surely enhances the compatibility, however, the circuit arrangement is quite complex due to dual data output facility with two kinds of the parallel diagnostic unit. Especially, the eight-input exclusive-NOR gate ENR5 consumes a large amount of real estate of the semiconductor pellet, and the read/write data lines D1 to D12 each bifurcated need wide wiring area.

SUMMARY OF THE INVENTION

It is therefore an important object of the present invention to provide a semiconductor memory device the circuit arrangement of which is simple in spite of dual data output facility.

To accomplish these objects, the present invention proposes to find discrepancy between first diagnostic signals when a serial data output facility is installed.

In accordance with the present invention, there is provided a semiconductor memory device installed in a single data output model or a parallel data output model, comprising: a) a memory unit having a plurality of memory cells for respectively storing data bits; b) an addressing unit coupled to the memory unit for allowing a first number of data bits to be read out from the memory cells, the first number of data bits being divided into a plurality of data bit groups; c) a first selector unit coupled to the memory unit for selecting a second number of data bits from the first number of data bits; d) a first diagnostic unit supplied with the first number of data bits and producing a plurality of first diagnostic signals each indicative of discrepancy or consistency of data bits of each of the data bit groups; e) a first data output unit coupled to the first selector unit and to the first diagnostic unit for supplying the second number of data bits or a plurality of resultant signal produced on the basis of the second number of data bits and the first diagnostic signals to an external device in the parallel data output model, the first data output unit being idle in the single data output model; f) a second selector unit connectable to the first selector unit for selecting a single data bit from the second number of data bits; g) a second diagnostic unit connectable to the first selector unit and to the first diagnostic unit for producing a single second resultant signal indicative of discrepancy or consistency of the first number of data bits; and h) a second data output unit coupled to the second selector unit and to the second diagnostic unit for supplying the single data bit or the single second resultant signal to an external device in the single data output model, the second data output unit being idle in the parallel data output model.

BRIEF DESCRIPTION OF THE DRAWINGS

The features and advantages of a semiconductor memory device with a parallel diagnostic unit according to the present invention will be more clearly understood from the following description taken in conjunction with the accompanying drawings in which.

DESCRIPTION OF THE PREFERRED EMBODIMENTS

First Embodiment

Figure 1:
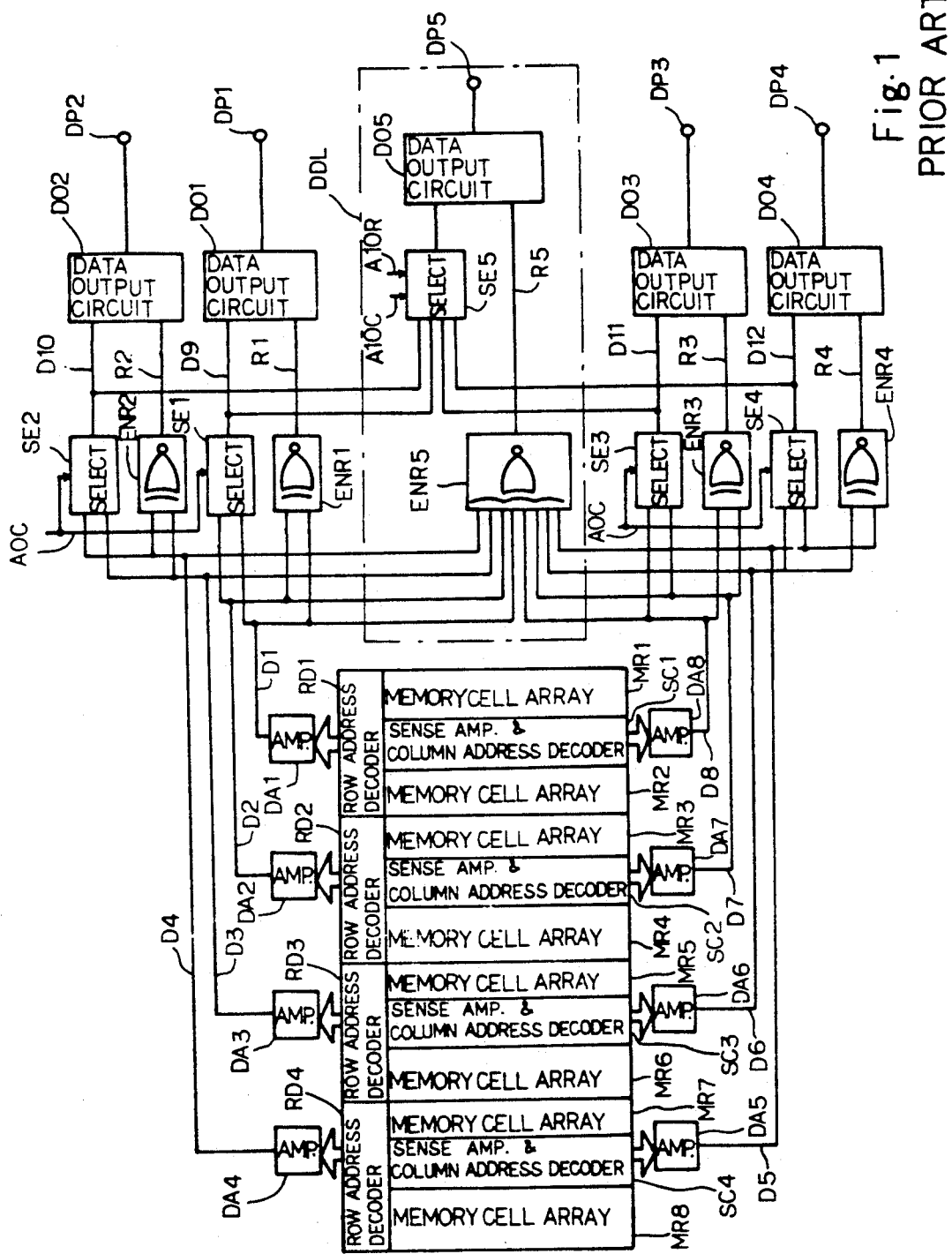
FIG. 1 is a block diagram showing the circuit arrangement of a prior art semiconductor memory device equipped with a parallel diagnostic unit associated with either serial or parallel data output facility.
Figure 2:
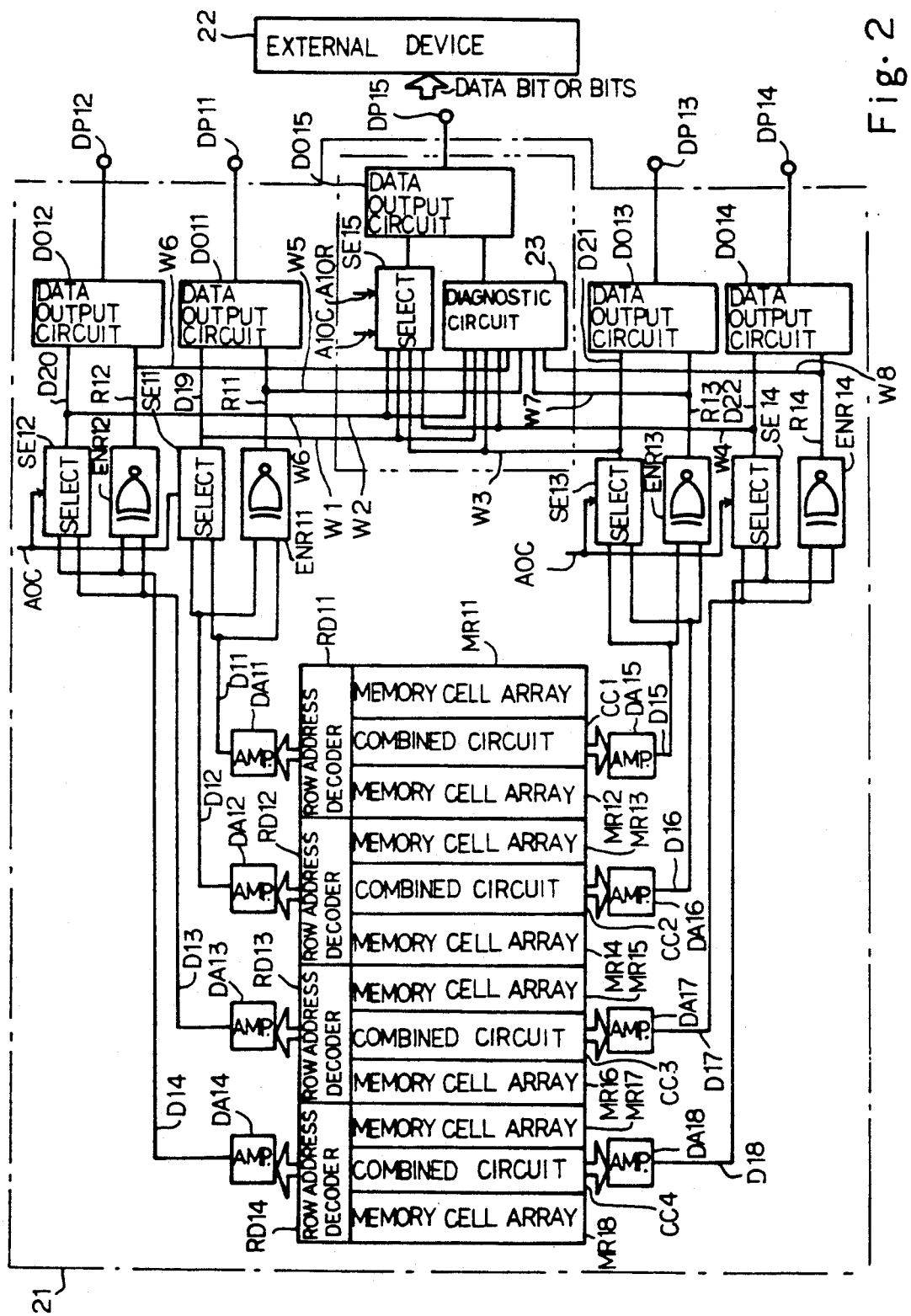
FIG. 2 is a block diagram showing the circuit arrangement of a semiconductor memory device according to the present invention.

Referring to FIG. 2 of the drawings, a semiconductor memory device embodying the present invention is fabricated on a single semiconductor chip 21, and either single or parallel data output facility is installed. If the single data output facility is installed, the semiconductor memory device is of the single data output model. On the other hand, the parallel data output facility makes the semiconductor memory device the parallel data output model. However, components circuits of the single data output facility are formed on the semiconductor chip 21 together with component circuits of the parallel data output facility as will be described hereinbelow.

The semiconductor memory device shown in FIG. 2 comprises eight memory cell arrays MR11, MR12, MR13, MR14, MR15, MR16, MR17 and MR18 each having a plurality of memory cells, four row address decoder units RD11, RD12, RD13 and RD14 coupled to the memory cell arrays MR11 to MR18, four combined circuits CC1, CC2, CC3 and CC4 each having a sense amplifier, a column address decoder and a column selector, and eight data amplifier circuits DA11, DA12, DA13, DA14, DA15, DA16, DA17 and DA18 associated with the eight memory cell arrays MR11 to MR18, respectively. The row address decoder units RD11 to RD14 are responsive to row address bits, and the column address decoders control the associated column selectors with most of column address bits. In this instance, the eight memory cell arrays MR11 to MR18 and the data amplifier circuits DA11 to DA18 form in combination a memory unit, and the row address decoder units RD11 to RD14, the combined circuits CC1 to CC4 as a whole constitute an addressing unit.

The data amplifier circuits DA11 to DA18 are coupled to read/write data lines D11, D12, D13, D14, D15, D16, D17 and D18, respectively, and the read/write data lines D11, D13, D15 and D17 are respectively paired with the read/write data lines D12, D14, D16 and D18. Therefore, the data bits on the read/write data line pairs form data bit groups, respectively. The read/write data line pairs are respectively coupled to selector circuits SE11, SE12, SE13 and SE14 and to exclusive-NOR gates ENR11, ENR12, ENR13 and ENR14. The selector circuits SE11 to SE14 form in combination a first selector unit, and the exclusive-NOR gates ENR11 to ENR14 as a whole constitute a first diagnostic unit. The selector circuits SE11 to SE14 are responsive to a column address bit A0C and each selects a single data bit from the data bit group supplied thereto. The selected data four bits are respectively transferred to read/write data lines D19, D20, D21 and D22, and the read/write data lines D19 to D22 are coupled to data output circuits DO11, DO12, DO13 and DO14. The exclusive-NOR gates ENR11 to ENR14 are also coupled to the data output circuits DO11 to DO14 by means of diagnostic lines R11 to R14. The data output circuits DO11 to DO14 are, in turn, coupled to data pins DP11, DP12, DP13 and DP14, and the semiconductor memory device is communicable with an external device 22 through the data pins DP11 to DP14. In this instance, the data output circuits DO11 to DO14 serves as a first data output unit. If the semiconductor memory device is installed into the parallel data output model, the read/write data lines D19 to D22 and the diagnostic lines R11 to R14 are formed from the selector circuits SE11 to SE14 and the exclusive-NOR gates ENR11 to ENR14 to the data output circuits DO11 to DO14, and the data output circuits DO11 to DO14 are coupled through bonding wires to the data pins DP11 to DP14. However, if the semiconductor memory device is of the single data output model, those lines D19 to D22 and R11 to R14 are replaced with interconnections W1 to W8 as described hereinbelow, and no bonding operation is carried out for the data output circuits DO11 to DO14, but the data output circuits DO11 to DO14 are bonded to the data pins DP11 to DP14.

For the single data output model, the semiconductor memory device is equipped with a selector circuit SE15, a second diagnostic circuit 23 and a second data output circuit DO15. The interconnections W1 to W4 couple the selector circuits SE11 to SE14 with the selector circuit SE15 and with the second diagnostic circuit 23, and the exclusive-NOR gates ENR11 to ENR14 are coupled to the second diagnostic circuit 23 by means of the interconnections W5 to W8. However, the interconnections W1 to W8 are not formed in the parallel data output model. The selector circuit SE15 serves as a second selector unit, and is responsive to the column address bits A10C and A10R for transferring one of the data bits on the interconnections W1 to W4 to the second output circuit DO15. The second diagnostic circuit 23 checks the first diagnostic signals and the four data bits on the interconnections W1 to W8 to see whether or not at least any one of the data bits is different in logic level from the other data bits, and produces a single second resultant signal indicative of discrepancy or consistency of the eight data bits. The second data output circuit DO15 supplies the single data bit or the single second resultant signal to the data pin DP15 depending upon the mode of operation.

Figure 3:
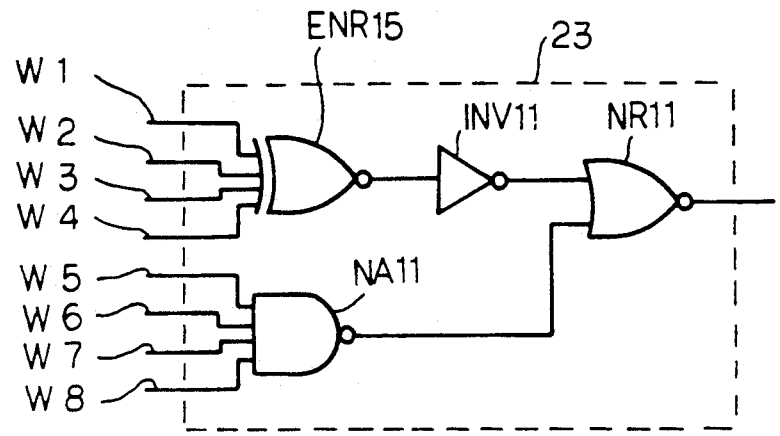
FIG. 3 is a circuit diagram showing the arrangement of a diagnostic unit incorporated in the semiconductor memory device shown in FIG. 2.

The second diagnostic circuit 23 is illustrated in detail in FIG. 3 and comprises an exclusive-NOR gate coupled at the input nodes thereof to the interconnections W1 to W4, a NAND gate NA11 coupled at the input nodes thereof to the interconnections W5 to W8, an inverter circuit INV11 coupled at the input node thereof to the output node of the exclusive-NOR gate ENR15, and a NOR gate NR11 coupled at the input nodes thereof to the output nodes of the inverter circuit INV11 and the NAND gate NA11. The output node of the NOR gate NR11 is coupled to the second data output circuit DO15.

Since the read/write data lines D11 to D18 are not coupled to the diagnostic circuit 23, the read/write data lines D11 to D18 are relatively simple rather than the read/write data lines D1 to D8 of the prior art semiconductor memory device, and, accordingly, occupies a small amount of real estate. Moreover, the diagnostic circuit 23 are fabricated from the logic gates NA11, ENR15, INV11 and NR11, and the maximum number of the input nodes is four. Such a small number of input nodes makes the logic gate simple in circuit arrangement, and a small amount of real estate is consumed by the diagnostic circuit 23. As a consequence, the semiconductor memory device according to the present invention is simple in circuit arrangement and fabricated on a small-sized semiconductor chip without any sacrifice of the compatibility.

Description is hereinbelow made on the circuit behaviors of the semiconductor memory device according to the present invention. First, the semiconductor memory device is assumed to be of the parallel data output model. Prior to delivery from the manufacturing facility, the semiconductor memory device is subjected to a diagnosis, wherein data bits of either logic "1" or "0" level are written into the memory cell arrays MR11 to MR18, and row and column addresses allow eight data bits to be read out from the memory cell arrays MR11 to MR18 to the data amplifier circuits DA11 to DA18. The eight data bits are propagated to the selector circuits SE11 to SE14 as well as to the exclusive-NOR gates ENR11 to ENR14, and the exclusive-NOR gates ENR11 to ENR14 produce the first diagnostic signals indicative of discrepancy or consistency of the data bits supplied thereto. The first diagnostic signals are supplied to the diagnostic lines R11 to R14. The selector circuits SE11 to SE14 are responsive to the address bit A0C and transfer four data bits to the data output circuits DO1 to DO4. In this instance, the eight data bits are tantamount to a first number of data bits, and a second number of data bits are four.

The data output circuits DO1 to DO4 supply resultant signals produced on the basis of the four data bits and the diagnostic signals to the data pins DP1 to DP4, respectively. However, if the semiconductor memory device becomes active in the usual read-out mode of operation, the diagnostic signals are ignored, and the data output circuits DO1 to DO4 transfer the four data bits to the data pins DP1 to DP4, respectively.

On the other hand, if the parallel data output facility is replaced with the serial data output facility, the selector circuits SE11 to SE14 supply the four data bits to the NAND gate NA11, and the exclusive-NOR gates ENR11 to ENR14 supply the first diagnostic signals to the exclusive-NOR gate ENR15. If any one of the four diagnostic signals is different in logic level from the other diagnostic signals, the NAND gate NA11 shifts the output signal thereof to logic "1" level, but the diagnostic signals identical in logic level results in the output signal of logic "0" level. Thus, the combination of the exclusive-NOR gates ENR11 to ENR14 and the NAND gate NA11 finds a defective memory cell from the eight memory cells designated by the row and column address bits. However, if two data bits read-out from two defective memory cells are supplied to one of the exclusive-NOR gates ENR11 to ENR14, all of the first diagnostic signals are logic "1" level, and the combination can not find the defective memory cells. However, the selector circuit fed with the data bits read-out from the defective memory cells supplies the exclusive-NOR gate ENR15 on of the data bits which is different in logic level from the other data bits. Then, the exclusive-NOR gate ENR15 shifts the output signal thereof to logic "0" level, and the combination of the selector circuits SE11 to SE14 and the exclusive-NOR gate ENR15 fins two defective memory cells the data bits of which are unfortunately supplied to one of the exclusive-NOR gates ENR11, ENR12, ENR13 and ENR14. In either case, the NOR gate NR11 produces a single resultant signal of logic "0" level indicative of discrepancy of the eight data bits, and the data output circuit DO15 transfers the single resultant signal to the data pin. On the other hand, if all of the eight data bits are identical in logic level with one another, the signal resultant signal is logic "1" level indicative of consistency of the eight data bits.

However, when the semiconductor memory device enters into the usual read-out mode of operation, the selector circuit SE15 is responsive to the column address bits A10C and A10R and transfers one of the four data bits to the data output circuit DO15. The data output circuit DO15 ignores the single resultant signal, and the single data bit is relayed from the selector circuit SE15 to the data pin DP15.

Second Embodiment

Figure 4:
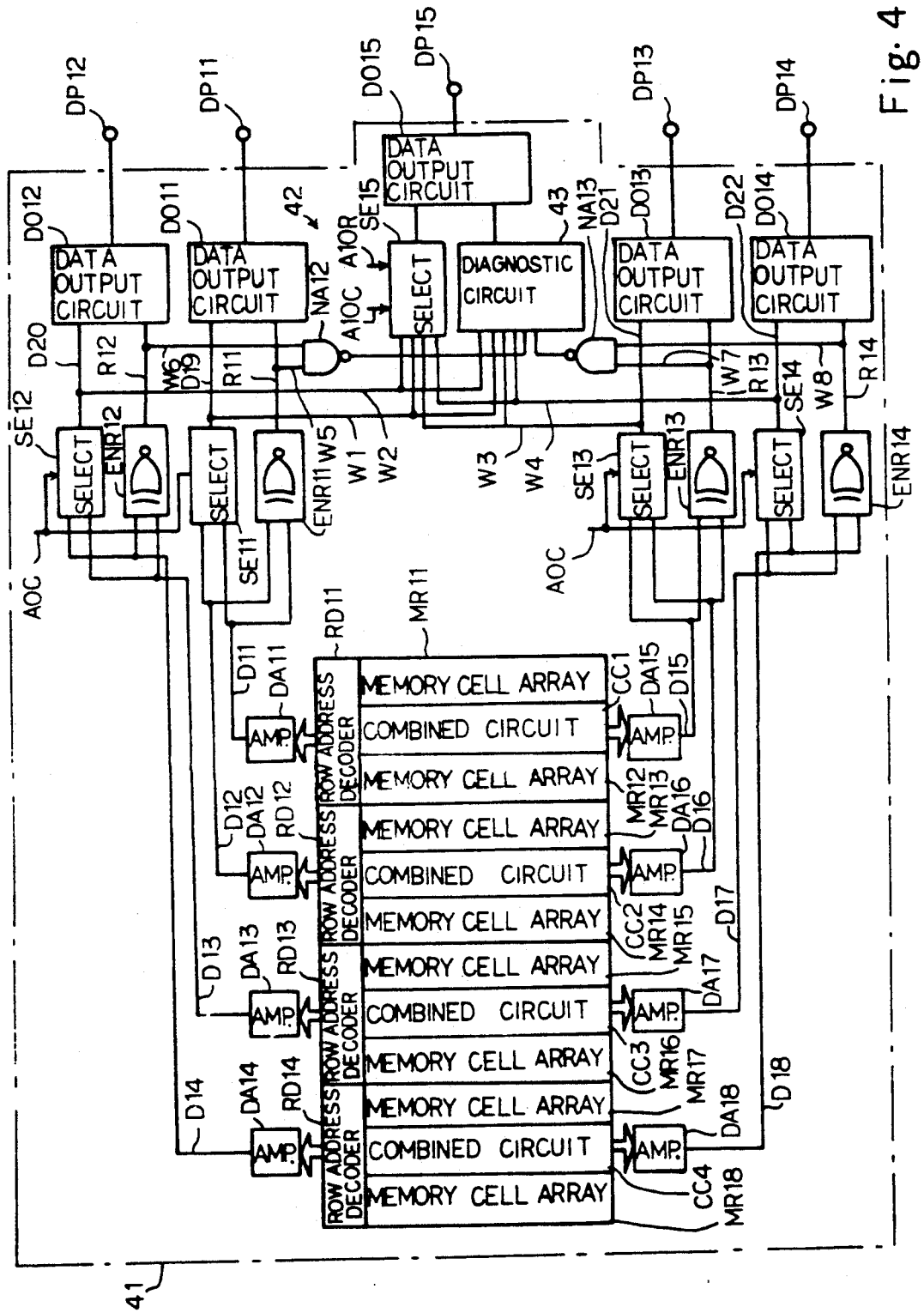
FIG. 4 is a block diagram showing the circuit arrangement of another semiconductor memory device according to the present invention.

Turning to FIG. 4, another semiconductor memory device embodying the present invention is fabricated on a single semiconductor chip 41. The semiconductor memory device shown in FIG. 4 is similar in arrangement to that shown in FIG. 2 except for a second diagnostic unit 42, and, for this reason, description is focused upon the diagnostic unit only. The other component circuits and units are designated by the same references used in FIG. 2 without any detailed description.

Figure 5:
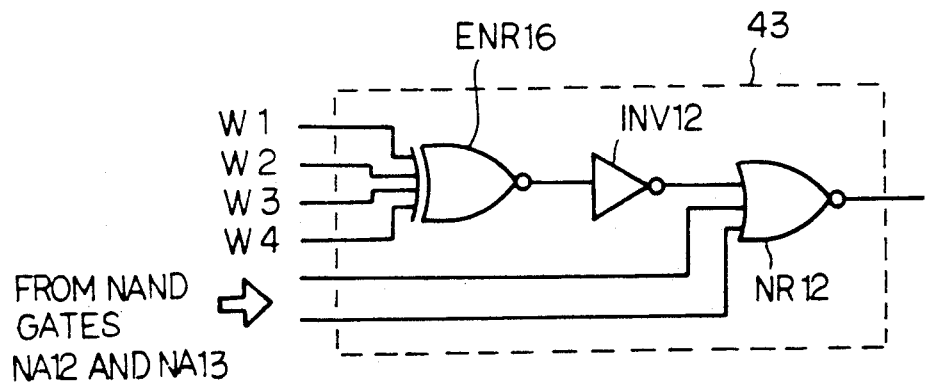
FIG. 5 is a circuit diagram showing the arrangement of a diagnostic unit incorporated in the semiconductor memory device shown in FIG. 4.

The second diagnostic unit 42 comprises two NAND gates NA12 and NA13 and a diagnostic circuit 43. The circuit arrangement of the diagnostic circuit 43 is illustrated in FIG. 5, and comprises an exclusive-NOR gate ENR16 coupled at the input nodes thereof to interconnections W1 to W4, an inverter circuit INV12 coupled at the input node thereof to the output node of said exclusive-NOR gate ENR16, and a NOR gate coupled at the input nodes thereof to the output node of said inverter circuit INV12 and the output nodes of the NAND gates NA12 and NA13. In the second embodiment, the NAND gate NA11 is replaced with the two NAND gates NA12 and NA13, but the circuit behavior is similar to that of the first embodiment. Since the two NAND gates NA12 and NA13 are located in the vicinity of the exclusive-NOR gates ENR11 to ENR14, the total amount of parasitic capacitance coupled to the interconnections W1 to W8 is decreased in comparison with the first embodiment.

Although particular embodiments of the present invention have been shown and described, it will be obvious to those skilled in the art that various changes and modifications may be made without departing from the spirit and scope of the present invention. For example, alternation between the single data output model and the parallel data output model may be carried out by selective bonding between the data output circuits DO11 and DO15 and the data pins DP11 and DP15 only. Moreover, the first number of data bits and the second number of data bits may be any natural numbers except for eight and four.

What is claimed is:

1. A semiconductor memory device installed in a single data output model or a parallel data output model, comprising:
   a) a memory unit having a plurality of memory cells for respectively storing data bits;
   b) an addressing unit coupled to said memory unit for allowing a first number of data bits to be read out from said memory cells, said first number of data bits being divided into a plurality of data bit groups;
   c) a first selector unit coupled to said memory unit for selecting a second number of data bits from said first number of data bits;
   d) a first diagnostic unit supplied with said first number of data bits and producing a plurality of first diagnostic signals each indicative of discrepancy or consistency of data bits of each of said data bit groups;
   e) a first data output unit coupled to said first selector unit and to said first diagnostic unit for supplying said second number of data bits or a plurality of resultant signals produced on the basis of said first diagnostic signals and said second number of data bits to an external device in said parallel data output model, said first data output unit being idle in said single data output model;
   f) a second selector unit connectable to said first selector unit for selecting a single data bit from said second number of data bits;
   g) a second diagnostic unit connectable to said first selector unit and to said first diagnostic unit for producing a single second resultant signal indicative of discrepancy or consistency of said first number of data bits; and
   h) a second data output unit coupled to said second selector unit and to said second diagnostic unit for supplying said single data bit or said single second resultant signal to an external device in said single data output model, said second data output unit being idle in said parallel data output model.

2. A semiconductor memory device as set forth in claim 1, in which said second diagnostic unit comprises an exclusive-NOR gate coupled at the input nodes thereof to said first selector unit, a NAND gate coupled at the input nodes thereof to said first diagnostic unit, an inverter circuit coupled at the input node thereof to the output node of said exclusive-OR gate, and a NOR gate coupled at the input nodes thereof to the output node of said inverter circuit and the output node of said NAND gate.

3. A semiconductor memory device as set forth in claim 2, in which said first diagnostic unit comprises a plurality of exclusive-NOR gates.

4. A semiconductor memory device as set forth in claim 1, in which said second diagnostic unit comprises a plurality of NAND gates coupled to said first diagnostic unit and a diagnostic circuit coupled to said plurality of NAND gates.

5. A semiconductor memory device as set forth in claim 4, in which said second diagnostic circuit comprises an exclusive-NOR gate coupled at the input nodes thereof to said first selector unit, an inverter circuit coupled at the input node thereof to the output node of said exclusive-NOR gate, and a NOR gate coupled at the input nodes thereof to the output node of said inverter circuit and the output nodes of said plurality of NAND gates.

6. A semiconductor memory device as set forth in claim 5, in which said first diagnostic unit comprises a plurality of exclusive-NOR gates.

* * * * *